(12) United States Patent
Ryu

(10) Patent No.: US 8,227,173 B2
(45) Date of Patent: Jul. 24, 2012

(54) METHOD OF MANUFACTURING MULTI-LAYER CIRCUIT BOARD

(75) Inventor: Jae-chul Ryu, Seongnam-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 778 days.

(21) Appl. No.: 12/156,513

(22) Filed: Jun. 2, 2008

(65) Prior Publication Data

US 2009/0098478 A1    Apr. 16, 2009

(30) Foreign Application Priority Data

Oct. 16, 2007    (KR) .................. 10-2007-0104027

(51) Int. Cl.
*G03F 7/00*    (2006.01)

(52) U.S. Cl. ........ 430/311; 430/313; 430/314; 430/318; 430/258

(58) Field of Classification Search .................. None
See application file for complete search history.

(56) References Cited

U.S. PATENT DOCUMENTS 6,197,407 B1 *  3/2001  Andou et al. ................. 428/209
2006/0240364 A1 * 10/2006  Lauffer et al. ................. 430/315

FOREIGN PATENT DOCUMENTS

| KR | 10-2007-0013634 A | 1/2007 |
| KR | 10-2007-0025497 A | 3/2007 |
| KR | 10-0726238 B1 | 6/2007 |

OTHER PUBLICATIONS

Office Action established for KR 10-2007-0104027 (Oct. 25, 2011).

* cited by examiner

*Primary Examiner* — Daborah Chacko Davis
(74) *Attorney, Agent, or Firm* — Drinker Biddle & Reath LLP

(57) ABSTRACT

A method of manufacturing a multi-layer circuit layer is provided. One example method includes the steps of: preparing an upper substrate and a lower substrate, wherein each of the upper and lower substrates includes a carrier layer and a seed layer, which are detachably connected to each other; forming circuits including first circuit patterns on the upper substrate and second circuit patterns on the lower substrate by plating on the seed layer; preparing a core substrate, wherein circuit patterns comprising a conductive material are formed on the core substrate; coupling the upper substrate, the core substrate, and the lower substrate by interposing adhesive members; detaching the carrier layer from the seed layer; etching the seed layer, wherein the seed layer is removed; and electrically connecting the first circuit patterns and the second circuit patterns to the third circuit patterns, respectively.

10 Claims, 12 Drawing Sheets

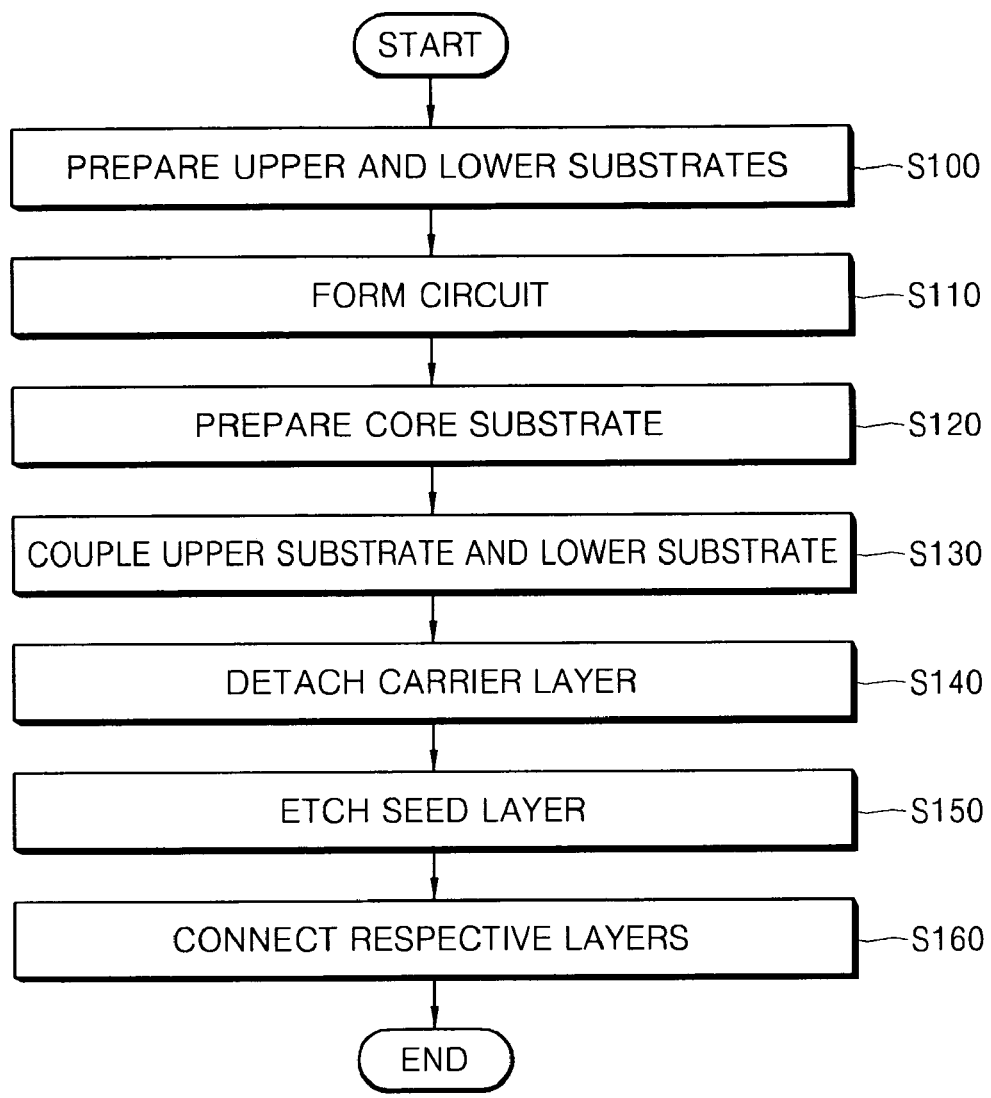
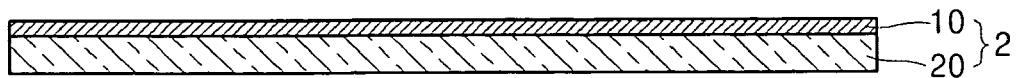

METHOD OF MANUFACTURING MULTI-LAYER CIRCUIT BOARD

CROSS-REFERENCE TO RELATED PATENT APPLICATION

This application claims the benefit of Korean Patent Application No. 10-2007-0104027, filed on Oct. 16, 2007, in the Korean Intellectual Property Office, the disclosure of which is incorporated herein in its entirety by reference.

BACKGROUND OF THE INVENTION

1. Field of the Invention

The present invention relates to a method of manufacturing a multi-layer circuit board, and more particularly, to a method of manufacturing a multi-layer circuit board including fine circuit patterns having increased peel strength with respect to a substrate.

2. Description of the Related Art

Recently, due to consumers' need for multi-functional products, the size of components, which constitute an electronic device, has been considerably reduced and the number of components in the structure of an electronic device has been increased. Accordingly, there is a need to configure a circuit board to accept a plurality of electronic devices with high density.

Multi-layer circuit boards are configured by stacking a plurality of substrates in a multi-layer structure in order to constitute an electronic device. Multi-layer circuit boards can perform various functions that are electrically more complicated than a single-sided or double-sided substrate, and are configured to accept electronic elements with high density. Thus, multi-layer circuit boards have been widely used in various electronic devices.

A conventional method of manufacturing a multi-layer circuit board includes: forming circuits for connecting elements to substrates constituting respective layers; stacking a plurality of substrates; forming a via hole for electrically connecting the respective layers; and plating the via hole.

A window is formed by using etching to remove a part of the circuits of the substrates in order to perform a drill operation for forming the via hole. However, it is complicated to form the window by using etching.

In order to form circuits on the substrates constituting the respective layers, etching or a semi-additive operation is used. However, when the circuits are formed using etching, since patterns are formed according to isotropic etching via an etching solution, there is a limit in forming fine circuit patterns. In addition, since there are problems with packaging a chip and a substrate, such as air void problems due to unevenness generated on surfaces of the substrates during etching, the reliability of a product including the multi-layer circuit board can deteriorate.

In addition, when the circuits are formed using a semi-additive operation, circuit patterns are formed by plating. However, since the peel strength of the circuit patterns with respect to a substrate is low, the reliability of a product completed after packaging can deteriorate. In addition, the circuit patterns formed on the substrate can be rolled out or detached from the substrate during manufacturing the multi-layer circuit board, and thus an error rate of the multi-layer circuit board is increased.

In a conventional method of manufacturing a multi-layer circuit board, since special equipment such as desmear equipment and electroless plating equipment is required for a semi-additive operation, operations constituting the method are complicated, and manufacturing costs of the method are increased.

SUMMARY OF THE INVENTION

The present invention provides a method of manufacturing a multi-layer circuit board including fine circuit patterns.

The present invention also provides a method of manufacturing a multi-layer circuit board including circuit patterns having increased peel strength.

The present invention also provides a method of manufacturing a multi-layer circuit board, by which a multi-layer circuit board can be simply manufactured at low cost.

The present invention also provides a method of manufacturing a multi-layer circuit board, in which etching is not necessary for forming a via hole that electrically connects respective layers.

According to an aspect of the present invention, there is provided a method of manufacturing a multi-layer circuit board, the method including: preparing an upper substrate and a lower substrate, wherein each of the upper and lower substrates includes a carrier layer and a seed layer, which are detachably connected to each other; forming circuits including first circuit patterns on the upper substrate and second circuit patterns on the lower substrate by plating on the seed layer; preparing a core substrate, wherein the core substrate is formed of an insulating material and third circuit patterns including a conductive material are formed on the core substrate; coupling the upper substrate, the core substrate, and the lower substrate by interposing an adhesive member, wherein the upper substrate, the core substrate, and the lower substrate are sequentially disposed to be aligned to one another so that the first and second circuit patterns face the core substrate; detaching the carrier layer from the seed layer; etching the seed layer, wherein the seed layer is removed; and electrically connecting the first circuit patterns and the second circuit patterns to the third circuit patterns, respectively, wherein a part of the adhesive members is removed between the first circuit patterns and the third circuit patterns, a part of the adhesive member is removed between the second circuit patterns and the third circuit patterns, and a connection portion including a conductive material is formed in a removed portion.

The forming of the circuits may include: coating photosensitive resist on the seed layer; disposing a mask and performing exposing and developing with respect to a resulting structure to thereby form a resist pattern layer on the seed layer; and plating the first circuit patterns and the second circuit patterns on the seed layer.

The seed layer may include a conductive material.

The carrier layer may include a conductive material.

The upper substrate, the lower substrate and the core substrate may be prepared to be respectively wound around rolls, and the preparing of the upper substrate and the lower substrate through the connecting may be performed while the upper substrate, the lower substrate, and the core substrate may be respectively released from the rolls.

The coupling may include heating and pressurizing the upper substrate and the lower substrate.

According to another aspect of the present invention, there is provided a method of manufacturing a multi-layer circuit board, the method including: preparing an upper substrate and a lower substrate, wherein each of the upper and lower substrates includes a carrier layer and a seed layer, which are detachably connected to each other; forming circuits, including first circuit patterns on the upper substrate and second circuit patterns on the lower substrate by plating on the seed layer; coupling the upper substrate and the lower substrate by interposing an adhesive member, wherein the upper substrate and the lower substrate are disposed to be aligned to each other so that the first circuit patterns and the second circuit patterns are facing each other; detaching the carrier layer from the seed layer; etching the seed layer, wherein the seed layer is removed; and electrically connecting the first circuit patterns to the second circuit patterns by forming a through hole in the adhesive member contacting the first circuit patterns and the second circuit patterns that are exposed to the outside in the etching, and a connection portion including a conductive material in the through hole.

BRIEF DESCRIPTION OF THE DRAWINGS

The above and other features and advantages of the present invention will become more apparent by describing in detail exemplary embodiments thereof with reference to the attached drawings in which:

FIG. 1 is a flow chart of an example method of manufacturing a multi-layer circuit board, according to an embodiment of the present invention;

FIG. 2 is a cross-sectional view for explaining an operation of preparing a upper substrate, in the method of manufacturing the circuit board of FIG. 1, according to an embodiment of the present invention;

DETAILED DESCRIPTION OF THE INVENTION

Hereinafter, the present invention will be described in detail by explaining exemplary embodiments of the invention with reference to the attached drawings.

FIG. 1 is a flow chart of a method of manufacturing a multi-layer circuit board, according to an embodiment of the present invention.

The method of FIG. 1 includes: preparing an upper substrate and a lower substrate (S100); forming circuits, in which first and second circuit patterns are respectively formed on the upper and lower substrates (S100); preparing a core substrate (S120); coupling the upper substrate, the core substrate, and the lower substrate (S130); detaching a carrier layer (S140); etching a seed layer, in which the seed layer is removed (S150), and electrically connecting respective layers (S160).

The method of FIG. 1 will be described in more detail with reference to FIGS. 2 through 17.

The preparing of the upper substrate and the lower substrate includes operations illustrated in FIGS. 2 through 7. Since the upper and lower substrates constituting respective layers of a multi-layer circuit board can be separately manufactured using the operations illustrated in FIGS. 2 through 7, the time for manufacturing the multi-layer circuit board can be remarkably reduced in comparison with a conventional manufacturing method in which respective layers are sequentially stacked.

FIG. 2 is a cross-sectional view for explaining an operation of preparing the upper substrate 2, in the method of manufacturing the circuit board of FIG. 1, according to an embodiment of the present invention.

The upper substrate 2 includes a carrier layer 20 and a seed layer 10. Since the carrier layer 20 and the seed layer 10 are detachably coupled to each other, the seed layer 10 can be maintained to be coupled to the carrier layer 20 during manufacturing the multi-layer circuit board. The carrier layer 20 has a greater thickness than the thickness of the seed layer 10, and the carrier layer 20 supports the seed layer 10 so as to smoothly perform respective operations for forming circuits. In addition, the carrier layer 20 can be easily detached from the seed layer 10 after functions of the carrier layer 20 for supporting the seed layer 10 are accomplished.

The seed layer 10 may be a thin film including a conductive material such as copper. The carrier layer 20 may be formed of an insulating material, or may be formed of a conductive material including copper as the seed layer 10 is formed of a conductive material. Since the carrier layer 20 and the seed layer 10 may both be formed of a conductive material, the carrier layer 20 may be just as flexible as the seed layer 10. Thus, the upper substrate 2, formed by attaching the carrier layer 20 to the seed layer 10, is flexible overall, and is prepared to be wound around a roll. The upper substrate 2 may be used in each operation of the method of manufacturing the circuit board.

Figure 3:
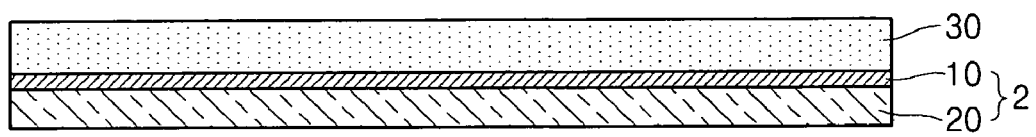
FIG. 3 is a cross-sectional view for explaining an operation of coating photosensitive resist on the upper substrate illustrated in FIG. 2, according to an embodiment of the present invention.
Figure 4:
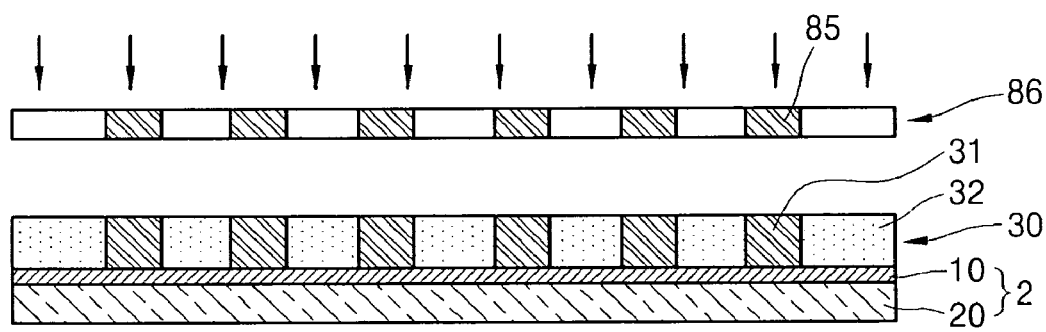
FIG. 4 is a cross-sectional view for explaining an operation of exposing the upper substrate illustrated in FIG. 3, according to an embodiment of the present invention.
Figure 5:
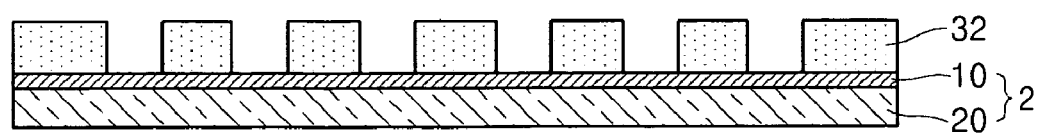
FIG. 5 is a cross-sectional view for explaining an operation of developing the upper substrate illustrated in FIG. 4, according to an embodiment of the present invention.

FIG. 3 is a cross-sectional view for explaining an operation of coating photosensitive resist on the upper substrate 2 illustrated in FIG. 2, according to an embodiment of the present invention. FIG. 4 is a cross-sectional view for explaining an operation of exposing the upper substrate 2 illustrated in FIG. 3, according to an embodiment of the present invention. FIG. 5 is a cross-sectional view for explaining an operation of developing the upper substrate 2 illustrated in FIG. 4, according to an embodiment of the present invention.

After the upper and lower substrates are prepared, the circuits are formed in order to form circuit patterns on the upper and lower substrates. The forming of the circuits includes forming a resist pattern layer, and plating.

The forming of the resist pattern layer includes: coating photosensitive resist 30 on a seed layer 10, which is illustrated in FIG. 3; disposing the mask 85 to expose the resulting structure, which is illustrated in FIG. 4; and developing illustrated in FIG. 5.

After the photosensitive resist 30 is formed on the seed layer 10, the mask 85 is disposed on or over the photosensitive resist 30. The mask 85 includes patterns 86 so as to remove desired parts of the photosensitive resist 30. The patterns 86 have a shape for exposing and developing according to a negative type. Portions to which light is blocked by the patterns 86 are to be removed using developing. The resulting structure is exposed and developed, and thus portions 31 of the photosensitive resist 30 are removed. The portions 31 of the photosensitive resist 30, which are to be removed, correspond to patterns 86 of the circuit, which are formed on the seed layer 10.

When the portions 31 of the photosensitive resist 30 are removed, a resist pattern layer 32 constituting the other portions of the photosensitive resist 30, which are not removed, is completed on the seed layer 10. Thus, a surface of the seed layer 10 is exposed to correspond to the patterns of the circuit that will be formed on the upper substrate 2, as illustrated in FIG. 5.

Figure 6:
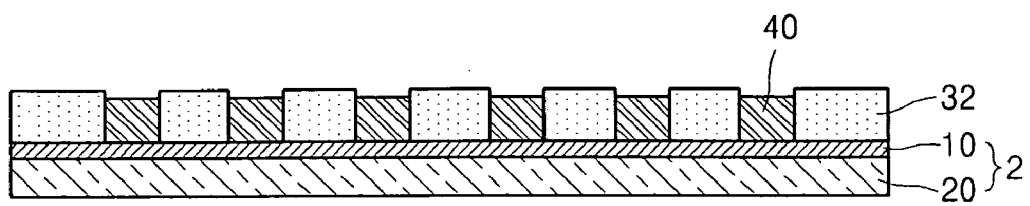
FIG. 6 is a cross-sectional view for explaining an operation of electroplating performed on the upper substrate illustrated in FIG. 5, according to an embodiment of the present invention.
Figure 7:
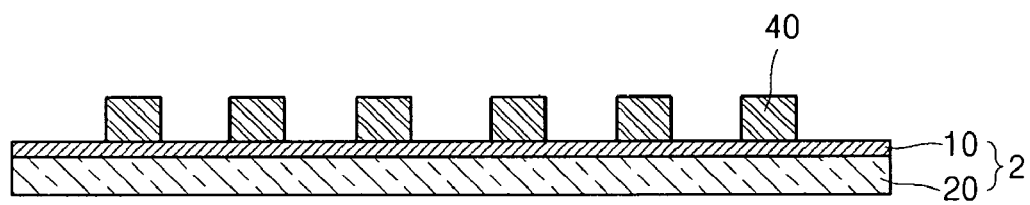
FIG. 7 is a cross-sectional view for explaining an operation of removing a resist pattern layer on the upper substrate illustrated in FIG. 6, according to an embodiment of the present invention.

FIG. 6 is a cross-sectional view for explaining an operation of electroplating performed on the upper substrate 2 illustrated in FIG. 5, according to an embodiment of the present invention. FIG. 7 is a cross-sectional view for explaining an operation of removing the resist pattern layer 32 on the upper substrate 2 illustrated in FIG. 6, according to an embodiment of the present invention.

In the operation of electroplating, which is illustrated in FIG. 6, first circuit patterns 40 are formed by electroplating parts of the seed layer 10, which are exposed by removing parts of the photosensitive resist 30. The method is not limited to electroplating, however. That is, electroless plating may alternatively be used.

Although the preparing of the upper substrate 2 is described with reference to FIGS. 2 through 8, a lower substrate may be also prepared using the same or substantially similar operation as the preparing of the upper substrate 2.

Figure 8:
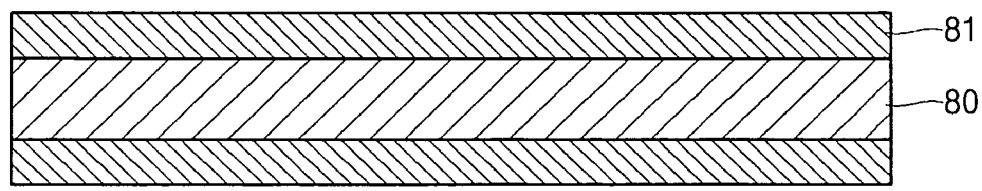
FIG. 8 is a cross-sectional view for explaining an operation of preparing a core substrate, according to an embodiment of the present invention.
Figure 9:
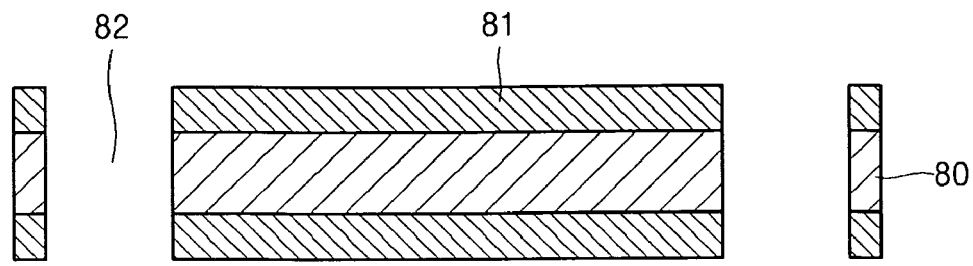
FIG. 9 is a cross-sectional view for explaining an operation of forming through holes in the core substrate illustrated in FIG. 8, according to an embodiment of the present invention.
Figure 10:
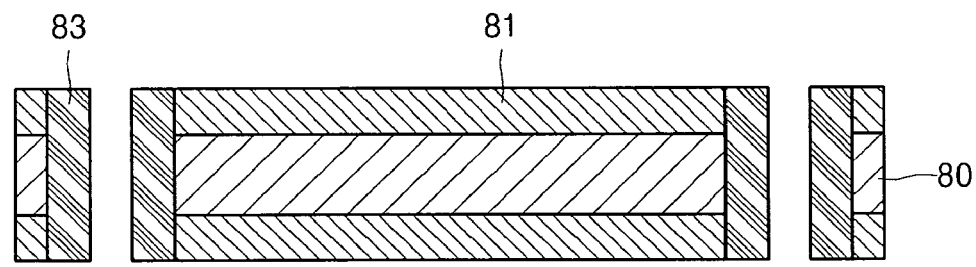
FIG. 10 is a cross-sectional view for explaining an operation of forming connection portions in the through holes illustrated in FIG. 9, according to an embodiment of the present invention.

FIG. 8 is a cross-sectional view for explaining an operation of preparing a core substrate 80, according to an embodiment of the present invention. FIG. 9 is a cross-sectional view for explaining an operation of forming through holes 82 in the core substrate 80 illustrated in FIG. 8, according to an embodiment of the present invention. FIG. 10 is a cross-sectional view for explaining an operation of forming connection portions 83 in the through holes 82 illustrated in FIG. 9, according to an embodiment of the present invention.

In the operation of preparing the core substrate 80, which is illustrated in FIG. 8, the core substrate 80 formed of an insulating material is prepared, wherein third circuit patterns formed of a conductive material are formed on the core substrate 80.

The core substrate 80 formed of an insulating material is prepared, wherein conductive layers 81 including a conductive material are respectively formed on both surfaces of the core substrate 80, as illustrated in FIG. 8. Then, the through holes 82 are formed by perforating the conductive layers 81 and the core substrate 80, as illustrated in FIG. 9. After the through holes 82 are formed, internal walls of the through holes 82 are coated with a conductive material to thereby perform an operation of forming the connection portions 83 that electrically connect conductive layers 81 on the top and bottom surfaces of the core substrate 80. The core substrate 80 may include a flexible material, such as a polyimide resin.

Figure 11:
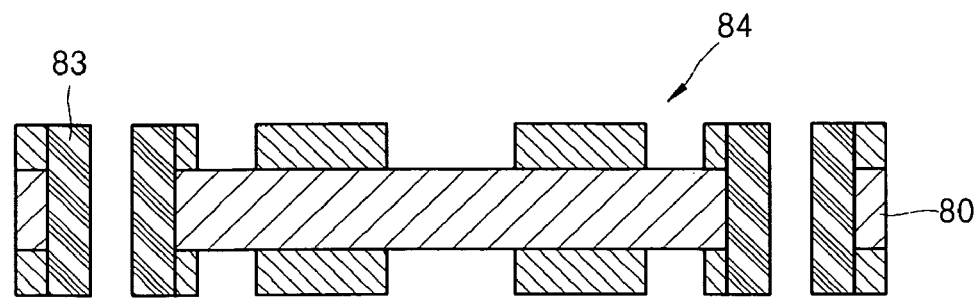
FIG. 11 is a cross-sectional view for explaining an operation of forming third circuit patterns on the core substrate illustrated in FIG. 10, according to an embodiment of the present invention.

FIG. 11 is a cross-sectional view for explaining an operation of forming third circuit patterns 84 on the core substrate 80 illustrated in FIG. 10, according to an embodiment of the present invention.

The preparing of the core substrate 80 may include: forming the third circuit patterns 84 on both surfaces of the core substrate 80, as illustrated in FIG. 11. The third circuit patterns 84 may be formed using an operation including: forming a resist pattern layer on the conductive layers 81; and etching the resulting structure.

The core substrate 80 may be prepared as described with reference to FIGS. 8 through 11, but the present invention is not limited thereto. Various methods may be used in the present invention. That is, the core substrate 80 may be prepared by reversing the order of the forming of the through holes 82 and the connection portions 83, and the forming of the third circuit patterns 84, which are respectively illustrated in FIGS. 9 and 10. In addition, the third circuit patterns 84 formed of a conductive material may be formed on the core substrate 80 by printing or other additive process.

Figure 12:
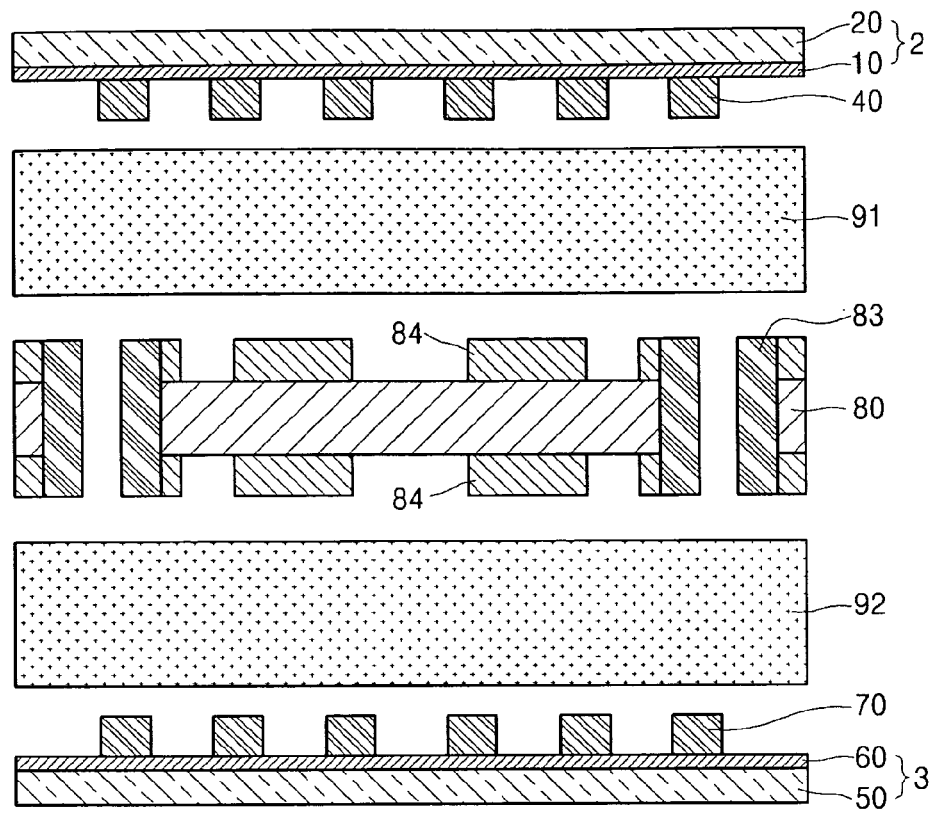
FIG. 12 is a cross-sectional view for explaining an operation of aligning the upper and lower substrates manufactured through the operations of FIGS. 2 through 7, and the core substrate illustrated in FIG. 11, according to an embodiment of the present invention.
Figure 13:
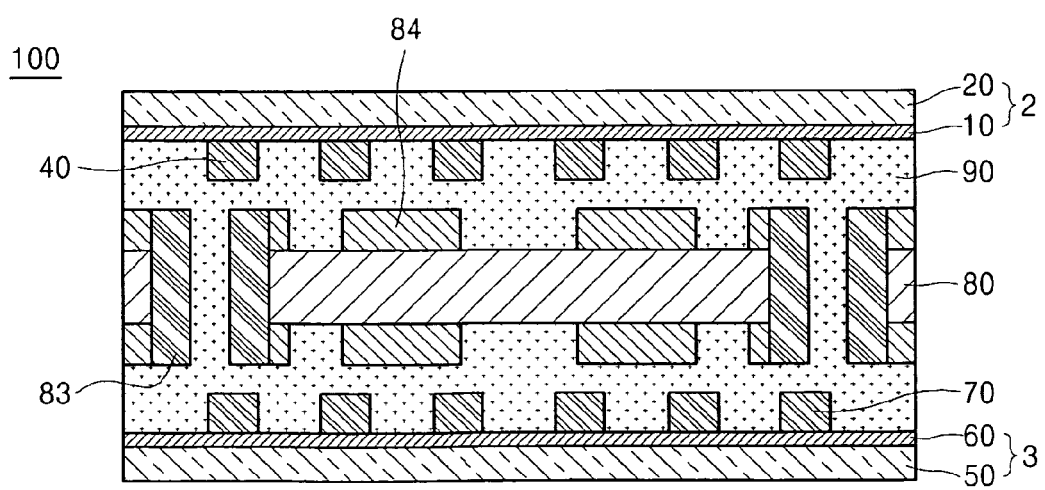
FIG. 13 is a cross-sectional view for explaining an operation of coupling the upper and lower substrates, and the core substrate, which are illustrated in FIG. 12, according to an embodiment of the present invention.

FIG. 12 is a cross-sectional view for explaining an operation of aligning the upper and lower substrates 2 and 3 manufactured through the operations of FIGS. 2 through 7, and the core substrate 80 illustrated in FIG. 11, according to an embodiment of the present invention. FIG. 13 is a cross-sectional view for explaining an operation of coupling the upper and lower substrates 2 and 3, and the core substrate 80, which are illustrated in FIG. 12, according to an embodiment of the present invention.

Independently from the operation of preparing the upper substrate 2, the lower substrate 3 may be prepared using the same operations as the operations illustrated in FIGS. 2 through 7.

The lower substrate 3 includes a carrier layer 50 and a seed layer 60 that are detachably coupled to each other. Second circuit patterns 70 are formed on the seed layer 60.

When the preparing of the upper substrate 2, the lower substrate 3, and the core substrate 80 is terminated, the upper substrate 2, the lower substrate 3, and the core substrate 80 are aligned, as illustrated in FIG. 12. In the aligning operation, the upper substrate 2, the lower substrate 3, and the core substrate 80 are disposed so that the first circuit patterns 40 of the upper substrate 2 face the core substrate 80, and the second circuit patterns 70 of the lower substrate 3 face the core substrate 80. Next, relative positions of the circuit patterns 40, 70 and 84 are aligned.

In the aligning of the upper substrate 2, the lower substrate 3, and the core substrate 80, adhesive members 91 and 92 are respectively interposed between the upper substrate 2 and the top surface of the core substrate 80, and between the lower substrate 3 and the bottom surface the core substrate 80. The adhesive members 91 and 92 may each be a bonding sheet, prepreg, or the like, which includes an insulating material.

When the upper substrate 2, the lower substrate 3, and the core substrate 80 are aligned, the upper substrate 2, the lower substrate 3, and the core substrate 80 are then coupled together. For example, the upper substrate 2, the lower substrate 3, and the core substrate 80 may be coupled to each other by pressurizing the upper and lower substrates 2 and 3, and the core substrate 80. In addition, while the upper substrate 2, the lower substrate 3, and the core substrate 80 are pressurized, heat or ultrasonic waves may be applied to the upper substrate 2, the lower substrate 3, and the core substrate 80 to fix the substrates 2, 3 to the core substrate 80 by curing the adhesive members 91, 92.

When the coupling operation is complete, the upper substrate 2, the core substrate 80, and the lower substrate 3 are coupled to each other, so that an insulating layer 90 is disposed between the upper substrate 2 and the core substrate 80, and between the lower substrate 3 and the core substrate 80, to thereby complete a stack substrate 100 (FIG. 13) having various layers. The insulating layer 90 is defined by adhesive members 91 and 92 being fused together during the coupling operation.

Figure 14:
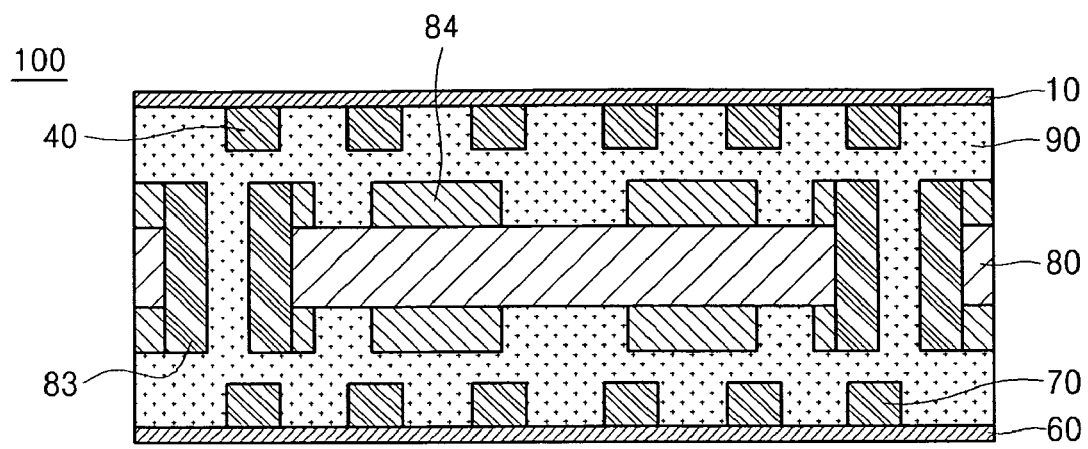
FIG. 14 is a cross-sectional view for explaining an operation of removing carrier layers from a stack substrate illustrated in FIG. 13, according to an embodiment of the present invention.

FIG. 14 is a cross-sectional view for explaining an operation of removing carrier layers 20 and 50 from the stack substrate 100 illustrated in FIG. 13, according to an embodiment of the present invention.

After the upper substrate 2, the core substrate 80, and the lower substrate 3 are stacked and coupled together, the carrier layers 20 and 50 are detached from the respective seed layers 10 and 60. Since the seed layers 10 and 60 and the carrier layers 20 and 50 are detachably coupled, respectively, the carrier layers 20 and 50 can be respectively detached from the stack substrate 100 to be reclaimed and recycled and/or reused after the upper substrate 2, the core substrate 80, and the lower substrate 3 are pressurized to be coupled to each other.

Figure 15:
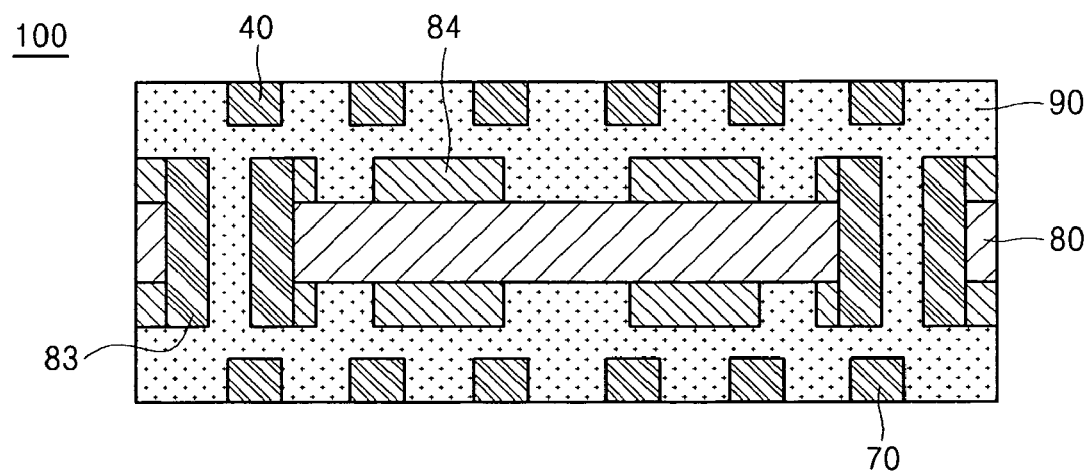
FIG. 15 is a cross-sectional view for explaining an operation of removing seed layers from the stack substrate illustrated in FIG. 14, according to an embodiment of the present invention.

FIG. 15 is a cross-sectional view for explaining an operation of removing the seed layers 10 and 60 from the stack substrate 100 illustrated in FIG. 14, according to an embodiment of the present invention.

When the carrier layers 20 and 50 are detached from the stack substrate 100, the seed layers 10 and 60 are left on both surfaces of the stack substrate 100. The seed layers 10 and 60 may be removed by an etching operation. Since the seed layers 10 and 60 are each a thin film which may include a conductive material such as copper, the seed layers 10 and 60 can be easily removed using etching. In the etching operation for removing the seed layers 10 and 60, since only a conductive thin film has to be removed, and simultaneously the first circuit patterns 40 and the second circuit patterns 70 are to be left, half etching can be used.

Since the seed layers 10 and 60 can be easily and cleanly removed using the half etching, both of the top and bottom surfaces of the stack substrate 100 can have a smooth surface with no unevenness.

As illustrated in FIG. 15, the first circuit patterns 40 and the second circuit patterns 70 are respectively exposed from the both surfaces of the stack substrate 100. That is, only one surface of four surfaces, which constitute each sectional shape of the first circuit patterns 40 or the second circuit patterns 70, is exposed to the outside, and the other three surfaces are embedded in the insulating layer 90. Accordingly, since the peel strength of the first circuit patterns 40 and the second circuit patterns 70 with respect to the stack substrate 100 is remarkably increased, and the first circuit patterns 40 and the second circuit patterns 70 are not easily detached from the stack substrate 100 when manufacturing the multi-layer circuit board or a package operation of assembling elements including the completed multi-layer circuit board, the reliability of a product including the multi-layer circuit board can be improved.

Figure 16:
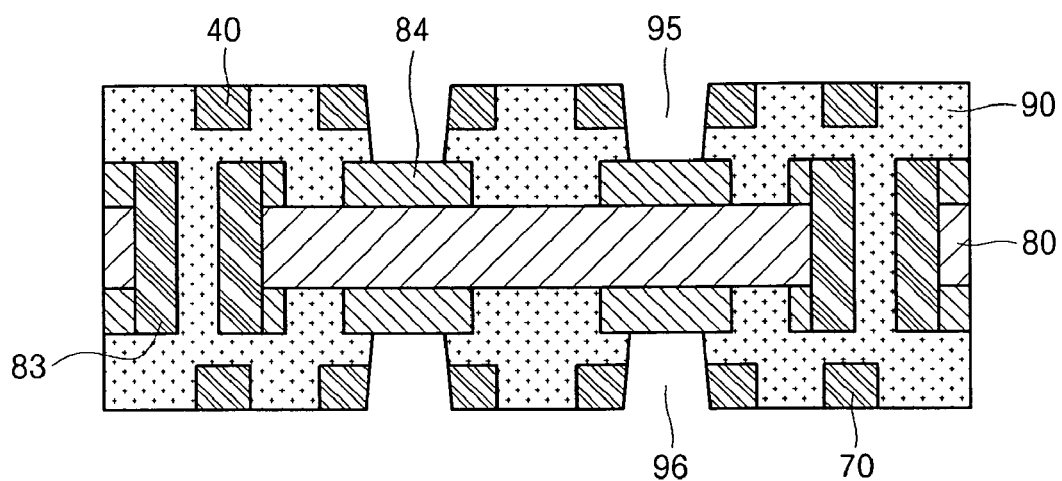
FIG. 16 is a cross-sectional view for explaining an operation of forming open grooves in the stack substrate illustrated in FIG. 15, according to an embodiment of the present invention.
Figure 17:
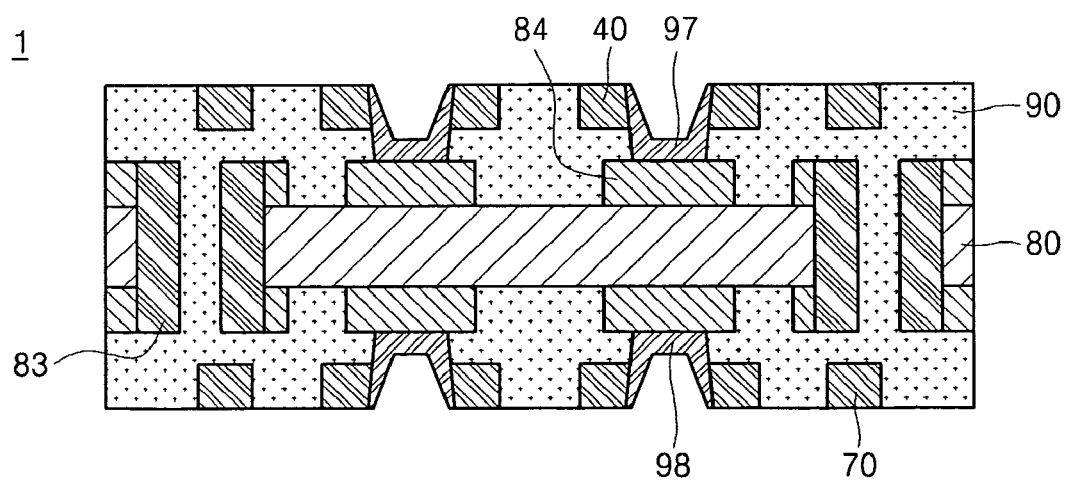
FIG. 17 is a cross-sectional view for explaining an operation of forming connection portions in the stack substrate illustrated in FIG. 16, according to an embodiment of the present invention.

FIG. 16 is a cross-sectional view for explaining an operation of forming open grooves 95 and 96 in the stack substrate 100 illustrated in FIG. 15, according to an embodiment of the present invention. FIG. 17 is a cross-sectional view for explaining an operation of forming connection portions 97 and 98 in the stack substrate 100 illustrated in FIG. 16, according to an embodiment of the present invention.

After the etching operation for removing the seed layers 10, 60 is terminated, the connecting operation is performed, in which the first circuit patterns 40 and the second circuit patterns 70, which are respectively formed on opposite surfaces of the stack substrate 100 illustrated in FIG. 15, are electrically connected to the third circuit patterns 84 of the core substrate 80. After the connecting operation is terminated, the multi-layer circuit board 1 is completed, as illustrated in FIG. 17.

The connecting operation includes: removing a part of the insulating layer 90; forming the connection portions 97 and 98 by configuring a conductive material in the removed part; and electrically connecting the first circuit patterns 40 to the second circuit patterns 70. Since the insulating layer 90 is defined by the adhesive members 91 and 92 which are formed of an insulating material, the insulating layer 90 can be easily and mechanically processed using a means such as a laser drill.

In a conventional method of manufacturing a multi-layer circuit board, a perforating operation using a drill is necessary in order to connect respective layers constituting the multi-layer circuit board, and a window exposing a resin layer filled with a metal layer to the outside have to be formed for the perforating operation. An operation of forming the window is an operation of removing the metal layer by using various methods such as etching, or the like, the operation is complicated, and a circuit patterns are damaged.

However, in the method of manufacturing the circuit board according to an embodiment of the present invention, since the seed layers 10 and 60 are removed by using etching, and the insulating layer 90 is exposed to the outside, a complicated operation for forming a window is not necessary.

The connecting operation includes: forming the open grooves 95 and 96; and forming the connection portions 97 and 98 in the open grooves 95 and 96, respectively. In the forming of the open grooves 95 and 96, a part of the insulating layer 90 is removed between the first circuit patterns 40 and the third circuit patterns 84, and a part of the insulating layer 90 is removed between the second circuit patterns 70 and the third circuit patterns 84. To remove the insulating layer 90, a $CO_2$ laser, or the like may be used.

When the open grooves 95 and 96 are formed, parts of the third circuit patterns 84 are exposed to the outside through the open grooves 95 and 96. When the connection portions 97 and 98 formed of a conductive material are formed in the open grooves 95 and 96, the first circuit patterns 40 and the second circuit patterns 70 are electrically connected to the third circuit patterns 84, respectively.

Figure 18:
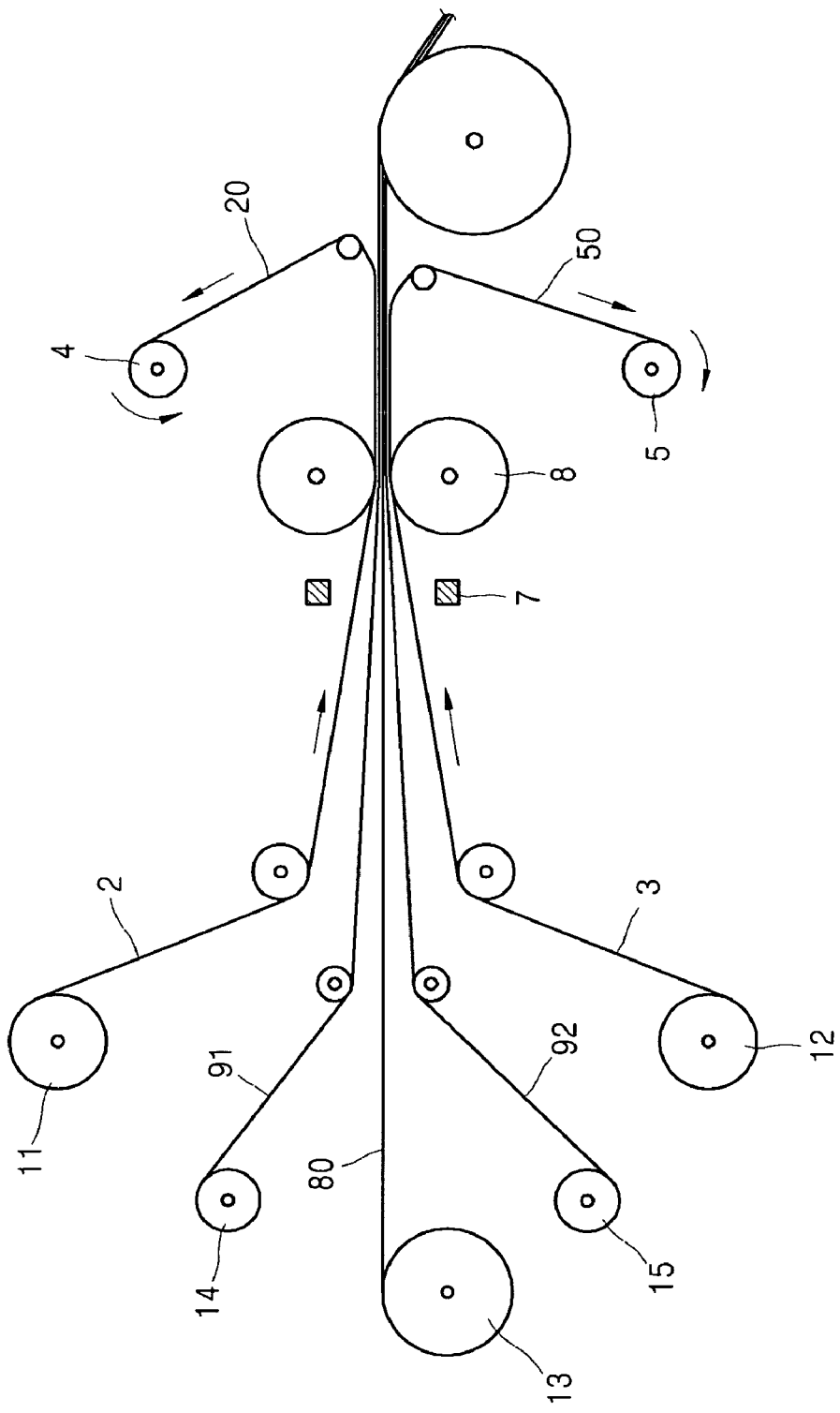
FIG. 18 is a diagrammatic view of an apparatus for manufacturing the multi-layer circuit board illustrated in FIGS. 1 through 17, according to an aspect of the present invention.

FIG. 18 is a diagrammatic view of an example apparatus for manufacturing the multi-layer circuit board illustrated in FIGS. 1 through 17, according to an embodiment of the present invention.

The upper substrate 2 is prepared to be wound around a first roll 11, the lower substrate 3 and the core substrate 80 are prepared to be wound around a second roll 12 and a third roll 13, respectively. The adhesive members 91 and 92 are prepared to be wound around fourth and fifth rolls 14 and 15, respectively. While the upper, lower and core substrates 2, 3 and 80, and the adhesive members 91 and 92 are released from the first through fifth rolls 11, 12, 13, 14 and 15, respectively, and respective operations illustrated in FIGS. 2 through 17 are performed.

Although the preparing of the upper substrate and the lower substrate, the forming of the circuit, and the preparing of the core substrate are not shown in FIG. 18, while the upper, lower and core substrates 2, 3 and 80, and the adhesive members 91 and 92 are released from the first through fifth rolls 11, 12, 13, 14 and 15, respectively, the preparing of the upper substrate and the lower substrate, the forming of the circuit, and the preparing of the core substrate are performed. While the substrates 2, 3 and 80, and the adhesive members 91 and 92 are passed between heaters 7, and between press rollers 8, the substrates 2, 3 and 80, and the adhesive members 91 and 92 are heated and pressurized. Supersonic waves may be applied to the substrates 2, 3, and 80 when passing through the press rollers 8 rather heating the substrates 2, 3, and 80 using the heaters 7.

When the substrates 2, 3, and 80 are coupled to each other while passing between the press rollers 8, the carrier layers 20 and 50, which are respectively detached from the upper substrate 2 and the lower substrate 3, are reclaimed by reclaim rollers 4 and 5, respectively.

After the carrier layers 20 and 50 are respectively detached from the upper substrate 2 and the lower substrate 3, the etching and connecting operations are performed as described above, and thus the multi-layer circuit is completed.

Figure 19:
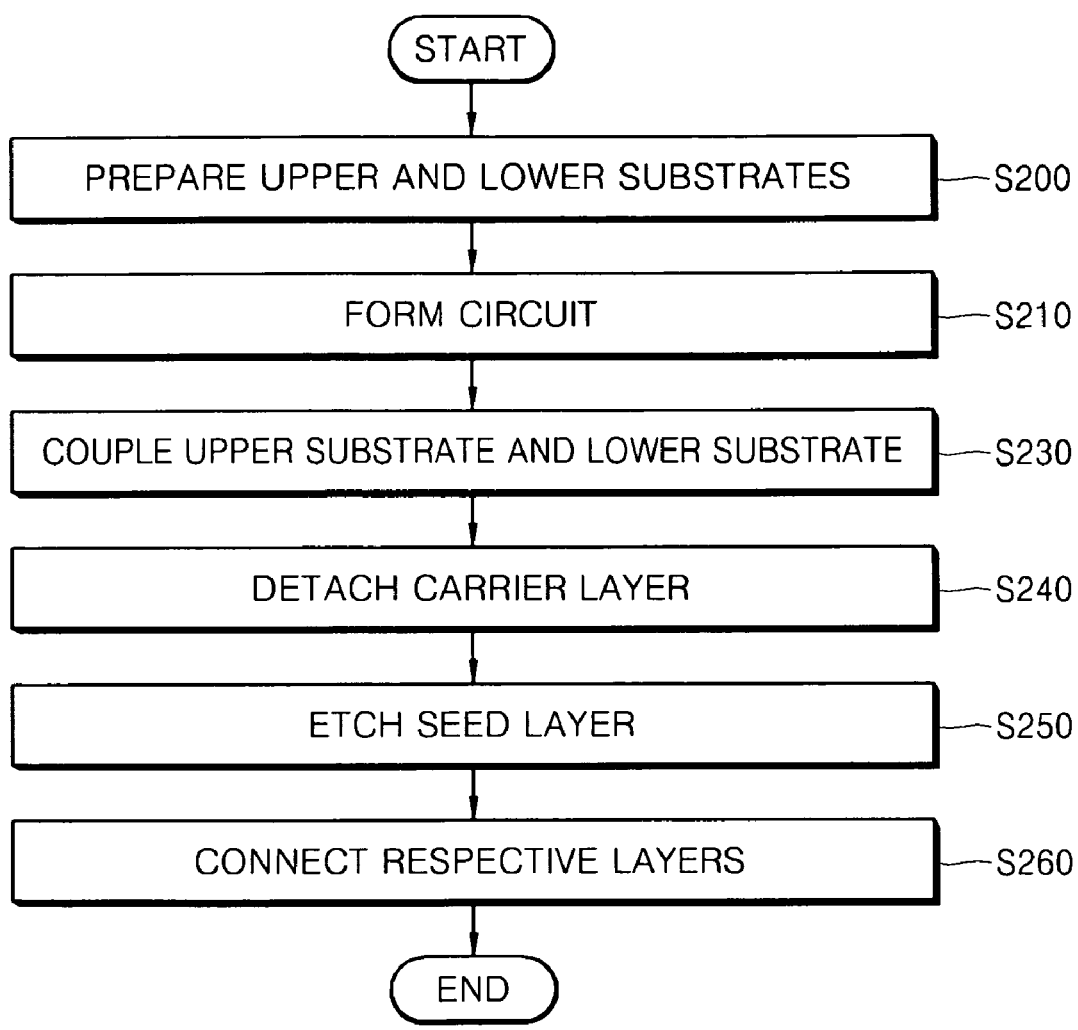
FIG. 19 is a flow chart of another example method of manufacturing a multi-layer circuit board, according to another embodiment of the present invention.

FIG. 19 is a flow chart of another example method of manufacturing a multi-layer circuit board, according to another embodiment of the present invention.

The method of FIG. 19 includes: preparing of an upper substrate and a lower substrate (S200); forming circuits, in which first and second circuit patterns are formed on the upper and lower substrates (S210); coupling of the upper and lower substrates (S230); detaching a carrier layer (S240); etching a seed layer, in which the seed layer is removed (S250); and electrically connecting respective layers (S260).

The method of FIG. 19 will be described with reference to FIGS. 20 through 27 in more detail.

Figure 20:
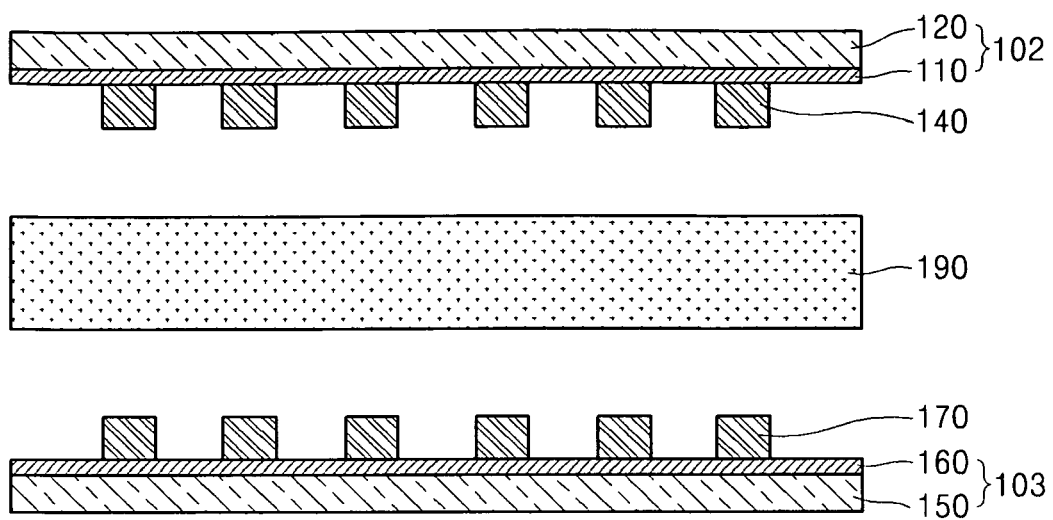
FIG. 20 is a cross-sectional view for explaining an operation of aligning upper and lower substrates, in the method of manufacturing the circuit board of FIG. 19, according to another embodiment of the present invention.

FIG. 20 is a cross-sectional view for explaining an operation of aligning upper and lower substrates 102 and 103, in the method of manufacturing the circuit board of FIG. 19, according to another embodiment of the present invention.

The preparing of the upper substrate 102 and the lower substrate 103 includes the same operations as those illustrated in FIGS. 2 through 7. Since the upper and lower substrates 102 and 103 constituting respective layers of the circuit board can be respectively manufactured by using the operations illustrated in FIGS. 2 though 7, a manufacturing time for manufacturing the multi-layer circuit board can be remarkably reduced in comparison with a conventional manufacturing method in which respective layers are sequentially stacked.

The upper substrate 102 includes a carrier layer 120 and a seed layer 110. The lower substrate 103 includes a carrier layer 150 and a seed layer 160. The carrier layers 120 and 150, and the seed layers 110 and 160 are detachably coupled, respectively. First circuit patterns 140 are formed on the seed layer 110 of the upper substrate 102, and second circuit patterns 170 are formed on the seed layer 160 of the lower substrate 103.

After the upper substrate 102 and the lower substrate 103 are prepared, the upper substrate 102 and the lower substrate 103 are aligned as illustrated in FIG. 20. In the aligning of the upper substrate 102 and the lower substrate 103, the upper substrate 102 and the lower substrate 103 are disposed so that the first circuit patterns 140 of the upper substrate 102 face the second circuit patterns 170 of the lower substrate 103 to each other.

When the upper and lower substrates 102 and 103 are aligned, an adhesive member 190 is interposed between the upper substrate 102 and the lower substrate 103. The adhesive member 190 may be a bonding sheet, prepreg, or the like, which includes an insulating material.

Figure 21:
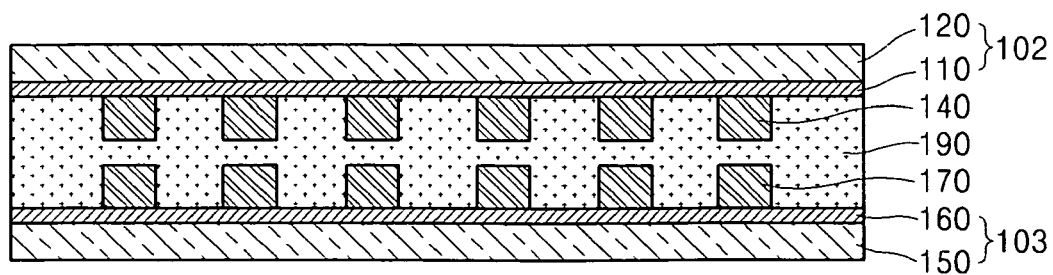
FIG. 21 is a cross-sectional view for explaining an operation of coupling the upper and lower substrates illustrated in FIG. 20, according to another embodiment of the present invention.

FIG. 21 is a cross-sectional view for explaining an operation of coupling the upper and lower substrates 102 and 103 illustrated in FIG. 20, according to another embodiment of the present invention.

After the upper and lower substrates 102 and 103 are aligned, the upper and lower substrates 102 and 103 are pressurized. At this time, heat or ultrasonic waves may be applied to the upper and lower substrates 102 and 103 to fix the substrates 102, 103 together by curing the adhesive members 190.

When the upper and lower substrates 102 and 103 are pressurized, the upper substrate 102 and the lower substrate 103 are coupled by interposing the adhesive member 190 therebetween to thereby complete a stack substrate 200 including at least two layers as illustrated in FIG. 21.

The adhesive member 190 is fused between the upper and lower substrates 102 and 103 to thereby constitute an insulating layer, in the applying of the heat or ultrasonic waves.

Figure 22:
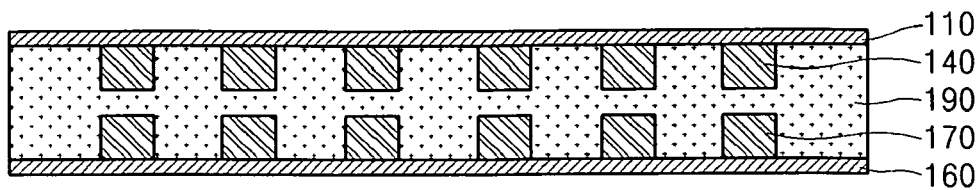
FIG. 22 is a cross-sectional view for explaining an operation of removing carrier layers from a stack substrate illustrated in FIG. 21, according to another embodiment of the present invention.

FIG. 22 is a cross-sectional view of an operation of removing carrier layers 110 and 160 from the stack substrate 200, according to another embodiment of the present invention.

After the upper and lower substrates 102 and 103 are stacked, the carrier layers 120 and 150 are detached from the seed layers 110 and 160. Since the seed layers 110 and 160, and the carrier layers 120 and 150 are detachably coupled, respectively, the carrier layers 120 and 150 can be respectively detached from the stack substrate 200 to be reclaimed after the upper and lower substrates 102 and 103 are pressurized to be coupled to each other.

Figure 23:
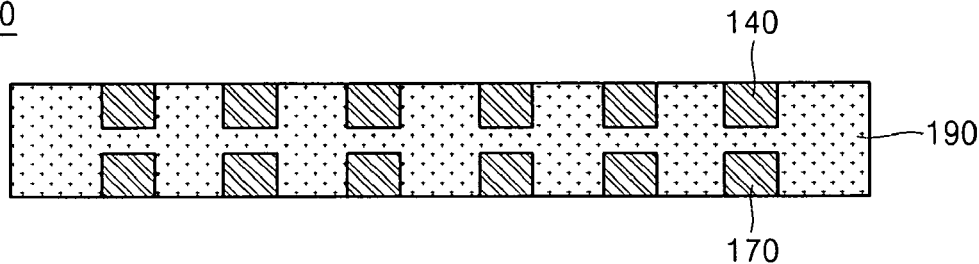
FIG. 23 is a cross-sectional view for explaining an operation of removing seed layers from the stack substrate illustrated in FIG. 22, according to another embodiment of the present invention.

FIG. 23 is a cross-sectional view for explaining an operation of removing the seed layers 110 and 160 from the stack substrate 200, according to another embodiment of the present invention.

When the carrier layers 120 and 150 are detached from the stack substrate 200, the seed layers 110 and 160 are left on both surfaces of the stack substrate 200. The seed layers 110 and 160 may be removed by an etching operation. Since the seed layers 110 and 160 may each be a thin film including a conductive material such as copper, the seed layers 110 and 160 can be easily removed using etching. In the etching operation for removing the seed layers 110 and 160, since only a conductive film has to be removed, and simultaneously the first circuit patterns 140 and the second circuit patterns 170 are to be left, half etching can be used.

Since the seed layers 110 and 160 can be easily and cleanly removed using the half etching, both surfaces of the stack substrate 200 can be smooth surfaces with no unevenness.

In addition, the first circuit patterns 140 and the second circuit patterns 170 are respectively exposed from the both surfaces of the stack substrate 200. That is, only one surface of four surfaces, which constitute each sectional shape of the first circuit patterns 140 and the second circuit patterns 170, is exposed to the outside, and the other three surfaces are embedded in the adhesive member 190. Accordingly, since the peel strength of the first circuit patterns 140 and the second circuit patterns 170 with respect to the stack substrate 200 is remarkably increased, and the first circuit patterns 140 and the second circuit patterns 170 are not easily detached from the stack substrate 200 when manufacturing the multi-layer circuit board or a package operation of assembling elements including the completed multi-layer circuit board, the reliability of the multi-layer circuit board can be improved.

Figure 24:
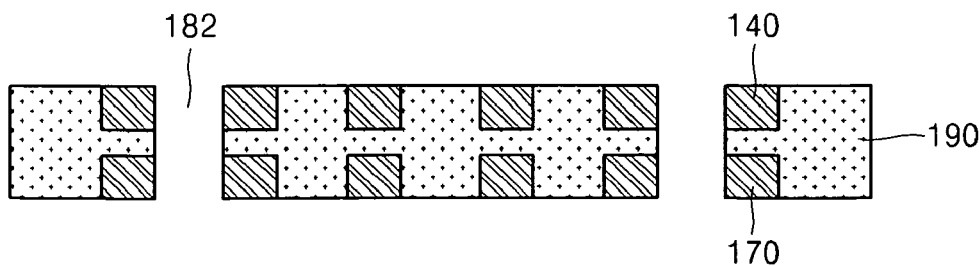
FIG. 24 is a cross-sectional view for explaining an operation of forming a through hole in the stack substrate illustrated in FIG. 23, according to another embodiment of the present invention.
Figure 25:
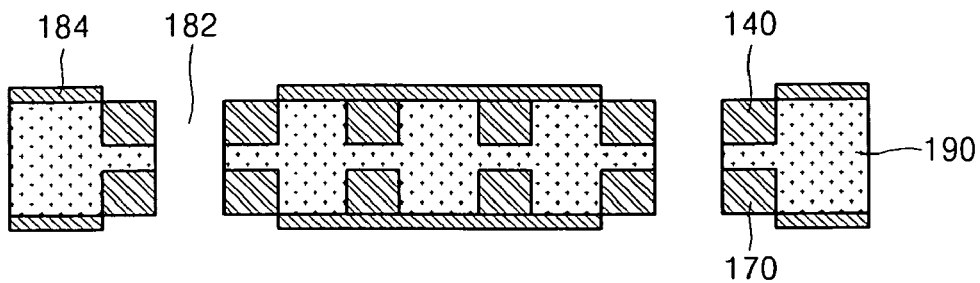
FIG. 25 is a cross-sectional view for explaining an operation of forming a mask in the stack substrate illustrated in FIG. 24, according to another embodiment of the present invention.
Figure 26:
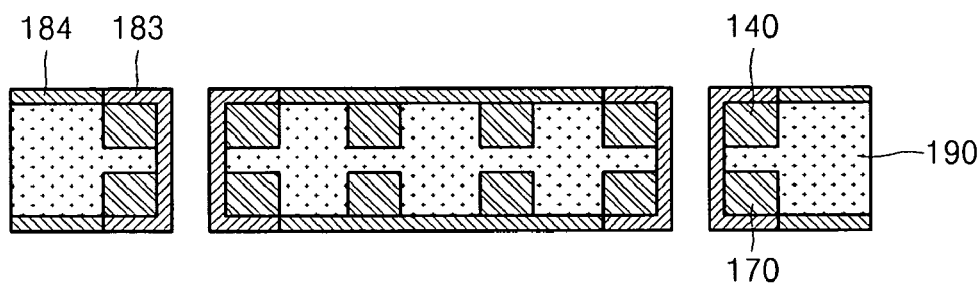
FIG. 26 is a cross-sectional view for explaining an operation of electroplating performed on the stack substrate illustrated in FIG. 25, according to another embodiment of the present invention.
Figure 27:
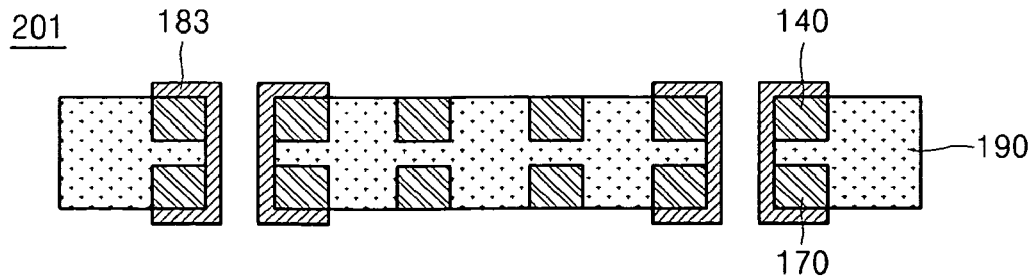
FIG. 27 is a cross-sectional view for explaining an operation of removing the mask from the stack substrate illustrated in FIG. 26, according to another embodiment of the present invention.

FIG. 24 is a cross-sectional view for explaining an operation of forming a through hole 182 in the stack substrate 200 illustrated in FIG. 23, according to another embodiment of the present invention. FIG. 25 is a cross-sectional view for explaining an operation of forming a mask in the stack substrate 200 illustrated in FIG. 24, according to another embodiment of the present invention. FIG. 26 is a cross-sectional view for explaining an operation of electroplating performed on the stack substrate 200 illustrated in FIG. 25, according to another embodiment of the present invention. FIG. 27 is a cross-sectional view for explaining an operation of removing the mask from the stack substrate 200 illustrated in FIG. 26, according to another embodiment of the present invention.

After the etching operation of removing the seed layers 110, 160 is terminated, the connecting operation is performed, in which each of the first circuit patterns 140 and the second circuit patterns 170, which are respectively formed on the both surfaces of the stack substrate 200 illustrated in FIG. 23, are electrically connected to each other. After the connecting operation is terminated, the multi-layer circuit board 201 is completed, as illustrated in FIG. 27.

The connecting operation includes: forming the through hole 182 in the adhesive member 190 contacting the first circuit patterns 140 and the second circuit patterns 170 that are exposed by the etching; and forming the connection portion 183 including a conductive material in the through hole 182, and electrically connecting the first circuit patterns 140 to the second circuit patterns 170.

Since the adhesive member 190 is an insulating material, the adhesive member 190 can be easily and mechanically processed using a means such as a laser drill.

In a conventional method of manufacturing a multi-layer circuit board, a perforating operation using a drill is necessary in order to connect respective layers constituting the multi-layer circuit board, and a window exposing a resin layer filled with a metal layer to the outside have to be formed for the perforating operation. An operation of forming the window is an operation of removing the metal layer by using various methods such as etching, or the like, the operation is complicated, and circuit patterns are damaged.

However, in the method of manufacturing the circuit board according to another embodiment of the present invention, since the seed layers 110 and 160 are removed by using etching, and the adhesive member 190 is exposed to the outside, a complicated operation for forming a window is not necessary.

The connecting operation includes: forming the through hole 182; and forming connection portion 183 in the through hole 182. In the forming of the through hole 182, a part of the adhesive member 190 is removed between the first circuit patterns 140 and the second circuit patterns 170. When the adhesive member 190 is removed, a $CO_2$ laser, or the like may be used.

After the through hole 182 is formed, resist 184 is formed on the adhesive member 190 so as to cover the resulting structure except for the through hole 182, in order to form the connection portion 183. When the resist 184 is formed, and then plating is performed with respect to the resulting structure, the connection portion 183 including a conductive material is formed on internal walls of the through hole 182, as illustrated in FIG. 26. In this case, when the resist 184 is removed, the multi-layer circuit board 201 is completed, as illustrated in FIG. 27.

In a method of manufacturing a multi-layer circuit board according to the present invention, since circuit patterns can be formed on a seed layer by using plating, a multi-layer circuit board including fine circuit patterns can be manufactured.

Since respective layers constituting the multi-layer circuit board are separately formed and coupled to each other in a coupling operation rather than being sequentially stacked, a manufacturing time for manufacturing the multi-layer circuit board is remarkably reduced.

Since a connecting operation, in which respective layers of the multi-layer circuit board are respectively connected, can be performed using a simple operation including removing an adhesive member exposed to the outside, and forming a connection portion including a conductive material in the removed portion, and an operation of etching a metal thin film is not necessary, the method of manufacturing the multi-layer circuit board according to the present invention can be simplified.

In a conventional method of manufacturing a multi-layer circuit board, only one surface of each of circuit patterns of the multi-layer circuit board is attached to a substrate, and thus the peel strength of the circuit patterns with respect to the substrate is weak. However, according to the present invention, since circuit patterns formed on a seed layer are embedded in an adhesive member, the peel strength of the circuit patterns with respect to a substrate can be remarkably increased. Thus, when electronic elements are packaged using the multi-layer circuit board manufactured using the method according to the present invention, since the circuit patterns are not easily detached from the substrate, the reliability of the multi-layer circuit board is increased.

In addition, since the multi-layer circuit board can have smooth surfaces with no unevenness by detaching a carrier layer and by removing a seed layer, a problem with packaging of chips and the multi-layer circuit board, such as an air void problem can be minimized. As a result, the reliability of the multi-layer circuit board can be improved.

Since the seed layer includes a conductive material, electroplating can be performed. Thus, equipment for electroless plating, which increases manufacturing costs and complicates a manufacturing method, is not necessary, and the multi-layer circuit board having fine circuit patterns can be simply manufactured at low cost.

The method of manufacturing the multi-layer circuit board according to the present invention can be used for manufacturing a light multi-layer circuit board, and can be used for manufacturing a flexible multi-layer circuit board by coupling flexible substrates. Thus, according to the present invention, the multi-layer board can be automatically manufactured by performing various operations used for manufacturing the multi-layer circuit board, in which materials are prepared to be wound around a roll or a reel.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A method of manufacturing a multi-layer circuit board, the method comprising:
   preparing an upper substrate and a lower substrate, the upper substrate and the lower substrate each including a carrier layer and a seed layer that are detachably connected to each other;
   forming first circuit patterns on the seed layer of the upper substrate;
   forming second circuit patterns on the seed layer of the lower substrate;
   preparing a core substrate including an insulating material, and third and fourth circuit patterns on respective upper and lower surfaces of the insulating material, the third circuit patterns different from the fourth circuit patterns;
   facing the seed layers of the upper and lower substrates toward the respective upper and lower surfaces of the insulating material;
   aligning the first and second circuit patterns respectively with the third and fourth circuit patterns;
   interposing adhesive members between the core substrate and respective ones of the upper and lower substrates;
   adhering the upper substrate, the core substrate, and the lower substrate using the adhesive members, the adhering leaving the first and second circuit patterns electrically isolated from the third and fourth circuit patterns;
   detaching the carrier layers from the seed layers;
   removing the seed layers to expose the first circuit patterns and the second circuit patterns; and
   forming a conductive material to electrically connect the first circuit patterns and the second circuit patterns respectively to the third circuit patterns and the fourth circuit patterns after the adhering.

2. The method of claim 1, wherein the forming of the conductive material comprises:
   removing a first part of a first of the adhesive members between the first circuit patterns and the third circuit patterns;
   removing a second part of a second of the adhesive members between the second circuit patterns and the third circuit patterns; and
   forming the conductive material in voids previously occupied by the first and second parts.

3. The method of claim 1, wherein the forming of the first circuit patterns comprises:
   coating photosensitive resist on the seed layer of the upper substrate;
   disposing a mask over the photosensitive resist;
   exposing and developing the photosensitive resist to form resist pattern layers on the seed layer of the upper substrate; and
   plating the first circuit patterns on the seed layer of the upper substrate.

4. The method of claim 1, wherein the seed layers comprise a conductive material.

5. The method of claim 1, wherein the carrier layers comprise a conductive material.

6. The method of claim 1 further comprising:
   providing each of the upper substrate, the lower substrate and the core substrate from respective rolls, each of the upper substrate, the lower substrate and the core substrate being wound around their respective roll,
   wherein the preparing of the core substrate comprises releasing the upper substrate, the lower substrate, and the core substrate from their respective roll.

7. The method of claim 1, wherein the adhering of the upper substrate, the core substrate, and the lower substrate comprises pressurizing the upper substrate and the lower substrate so that the first and second circuit patterns become embedded in the adhesive members.

8. The method of claim 7, further comprising curing the adhesive members.

9. The method of claim 8, wherein the curing of the adhesive members comprises applying heat or ultrasonic waves to the adhesive members.

10. The method of claim 1, wherein the removing of the seed layers comprises etching the seed layers.

* * * * *